(12) United States Patent
Zych et al.

(10) Patent No.: US 10,125,315 B2
(45) Date of Patent: Nov. 13, 2018

(54) PHOSPHORS AND PHOSPHOR-CONVERTED LEDS

(71) Applicant: MERCK PATENT GMBH, Darmstadt (DE)

(72) Inventors: Aleksander Zych, Darmstadt (DE); Ralf Petry, Griesheim (DE); Mathias Rapphahn, Greifswald (DE); Ingo Koehler, Darmstadt (DE); Stefan Tews, Greifswald (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 15/569,943

(22) PCT Filed: Mar. 30, 2016

(86) PCT No.: PCT/EP2016/000533
§ 371 (c)(1),
(2) Date: Oct. 27, 2017

(87) PCT Pub. No.: WO2016/173692
PCT Pub. Date: Nov. 3, 2016

(65) Prior Publication Data
US 2018/0155621 A1 Jun. 7, 2018

(30) Foreign Application Priority Data
Apr. 27, 2015 (EP) .................................... 15001236

(51) Int. Cl.
*C09K 11/77* (2006.01)
*C09K 11/79* (2006.01)
(Continued)

(52) U.S. Cl.
CPC ...... *C09K 11/7792* (2013.01); *C09K 11/7734* (2013.01); *H01L 33/502* (2013.01)

(58) Field of Classification Search
CPC ........... C09K 11/7734; C09K 11/7792; H01L 33/502
(Continued)

(56) References Cited

U.S. PATENT DOCUMENTS 6,802,990 B2 10/2004 Toda
2003/0124383 A1* 7/2003 Akiyama ............. C09K 11/592
428/690
(Continued)

FOREIGN PATENT DOCUMENTS

CN 101880528 A 11/2010
CN 101735805 B 3/2014
(Continued)

OTHER PUBLICATIONS

International search report for PCT/EP2016/000533 dated May 25, 2016.
(Continued)

*Primary Examiner* — Dao H Nguyen
(74) *Attorney, Agent, or Firm* — Millen White Zelano and Branigan, PC; John Sopp

(57) ABSTRACT

The present invention relates to pyrosilicate phosphors, to a process for the preparation thereof and to the use thereof as conversion phosphors. The present invention also relates to an emission-converting material comprising the conversion phosphor according to the invention, and to the use thereof in light sources, in particular pc-LEDs (phosphor converted light emitting devices). The present invention furthermore relates to light sources, in particular pc-LEDs, and to lighting units which comprise a primary light source and the emission-converting material according to the invention.

15 Claims, 4 Drawing Sheets

(51) Int. Cl.
*H01L 33/50* (2010.01)
*H01L 33/00* (2010.01)

(58) Field of Classification Search
USPC .............. 313/485, 486; 257/89, 98, 99, 103, 257/E33.059, E33.061, E33.072; 428/690, 691, 263; 73/866
See application file for complete search history.

(56) References Cited

U.S. PATENT DOCUMENTS

| | | |
|---|---|---|
| 2004/0027047 A1 | 2/2004 | Matsuda |
| 2006/0076571 A1* | 4/2006 | Hsieh .................... H01L 33/641 257/99 |
| 2007/0182308 A1* | 8/2007 | Zeng .................. C09K 11/7731 313/485 |
| 2007/0295116 A1* | 12/2007 | Le Mercier ........ C09K 11/7777 73/866 |
| 2009/0130484 A1* | 5/2009 | Kim ........................ C01B 33/26 428/691 |
| 2010/0214763 A1* | 8/2010 | Katou ................ C09K 11/7734 362/84 |
| 2010/0244067 A1* | 9/2010 | Winkler ............ C04B 35/62813 257/98 |

FOREIGN PATENT DOCUMENTS

| | | |
|---|---|---|
| EP | 1193306 A2 | 4/2002 |
| EP | 1811009 A1 | 7/2007 |
| JP | 2007154122 A | 6/2007 |
| WO | 2012165905 A2 | 12/2012 |
| WO | 2016173692 A1 | 11/2016 |

OTHER PUBLICATIONS

Sivakumar Vaidyanathan et al: "A novel green phosphor for three band white LEDs", Optical Sensing II, vol. 5941, Aug. 18, 2005 (Aug. 18, 2005), 1000 20th St. Bellingham WA 98225-6705 USA, pp. 594110-594110-9, XP055273266, ISSN: 0277-786X, ISBN: 978-1-62841-971-9.

Yoshinori Yonesaki et al: "Vitreous phase coating on glaserite-type alkaline earth silicate blue phosphor BaCaMgSiO:Eu", Journal of Alloys and Compounds, Elsevier Sequoia, Lausanne, CH, vol. 509, No. 35, Jun. 13, 2011 (Jun. 13, 2011), pp. 8738-8741, XP028260682, ISSN: 0925-8388.

* cited by examiner

PHOSPHORS AND PHOSPHOR-CONVERTED LEDS

The present invention relates to pyrosilicate phosphors, to a process for the preparation thereof and to the use thereof as conversion phosphors. The present invention also relates to an emission-converting material comprising the conversion phosphor according to the invention, and to the use thereof in light sources, in particular pc-LEDs (phosphor converted light emitting devices). The present invention furthermore relates to light sources, in particular pc-LEDs, and to lighting units which comprise a primary light source and the emission-converting material according to the invention.

Phosphor converted light emitting diodes (LEDs) or pc-LEDs are currently the prime candidates for solid state lighting (SSL). This is due to their energy saving properties where a high brightness can be achieved applying small electrical powers compared to other lighting devices. Also their compactness allows for smaller amounts of the phosphors to be used compared to e.g. fluorescent tubes. Furthermore, the final product, the LED lamp, may be used in ways not possible before from architectural point of view.

There are in principle three different approaches to obtaining white-emitting inorganic LEDs by additive colour mixing:

(1) RGB LEDs (red+green+blue LEDs), in which white light is generated by mixing the light from three different light-emitting diodes, which emit in the red, green and blue spectral region.

(2) Complementary systems, in which an emitting semiconductor (primary light source) emits, for example, blue light, which excites one or more phosphors (conversion phosphors) which then emit light of a longer wavelength. The white LEDs used today are mainly based on a concept where a blue LED chip ((In)GaN, emitting at around 440-480 nm, depending on the amount of In doping in the material) is covered by a phosphor layer. A part of the light emitted by the chip is transmitted giving a blue component and the rest is absorbed by the phosphor layer, yielding the phosphor emission. By mixing the blue and yellow light, white light is then produced. Alternatively, it is possible to use two or more phosphors which emit, for example, green or yellow and orange or red light.

(3) UV– or violet LED+RGB phosphor, in which a semiconductor, which emits in the near-UV or violet region of the spectrum (primary light source) emits light to the environment, in which three different conversion phosphors are excited to emit in the red, green and blue spectral region. Alternatively, it is possible to use two different phosphors which emit yellow or orange and blue.

Binary complementary systems have the advantage that they are capable of producing white light with only one primary light source and—in the simplest case—with only one conversion phosphor. The best-known of these systems consists of an indium aluminium gallium nitride chip as primary light source, which emits light in the blue spectral region, and a cerium-doped yttrium aluminium garnet (YAG:Ce) as conversion phosphor, which is excited in the blue region and emits light in the yellow spectral region. Some ortho-silicates $M_2SiO_4:Eu^{2+}$ (M=Ca, Sr, Ba) can also be used as yellow-orange emitters. However, the quality of light obtained through mixing of blue and yellow components is low due to the fact that there is a lack of red component in the overall emission. Improvements are obtained by addition of a red component, such as various nitrides and oxy-nitrides, doped with divalent europium or trivalent cerium ions, such as $M_2Si_5N_8:Eu^{2+}$ (M=Sr, Ba). However, the use of blue-emitting indium gallium nitride LEDs also results in a number of difficulties, such as strong dependence of the colour point on the thickness of the phosphor layer and strong spectral interaction between the luminophores owing to the small Stokes shift. Furthermore and even more important, deviations in the blue peak emission wavelength of the LED chip of as little as 2 nm lead to significant changes in the colour points. Therefore, such a system is very sensitive to small variations of the emission of the blue LED chip.

The requirements put on the phosphors used are generally as follows:
1. high colour rendering index (CRI) for good light quality,
2. high thermal stability (no significant emission intensity decrease at operating temperatures of T>150° C.),
3. high quantum efficiency (QE) of the phosphor,
4. high absorption of the phosphor at the emission wavelength of the LED chip,
5. high chemical stability.

An interesting alternative comes into play recently where the blue emitting LED chip is replaced by a near-UV or violet LED chip. In particular, the emission range between 370 and 430 nm is of interest, since the Stokes loss here on conversion into a white spectrum is not yet too great. An advantage of such a configuration, especially when employing a violet LED chip, is that the violet chip has a much better performance as a function of operating temperature as compared to the blue chip. This effect is known in the literature as "operating temperature droop". Furthermore, the influence of the deviation of the wavelength of the near-UV or violet chip is insignificant for the colour point of the final LED, as the complete emission of the near-UV or violet chip is converted to light of longer wavelength. Already these advantages are important enough to investigate phosphors for near-UV and violet LED chips.

Accordingly, near-UV and violet LEDs as the basis for white-emitting LEDs are the focus of a number of developments of LED light sources, and the research and development of novel conversion phosphors for near-UV and violet LEDs has been intensified in recent years. For this reason, inorganic fluorescent powders which can be excited in the near-UV and violet region of the spectrum are also, in particular, increasing more and more in importance today as conversion phosphors for light sources, in particular for pc-LEDs.

It is therefore an object of the present invention to provide novel compounds, which can be excited in the near-UV or violet region. It would be in particular desirable to provide green-emitting phosphors, which show strong absorption in the near-UV or violet region, but little or no absorption in the blue region of the spectrum as this facilitates the mixing of the colours to achieve the correct colour point and avoids several sequential absorption and emission processes, which will lower the emission efficiency. Preferably, those phosphors should furthermore show a high emission efficiency as well as low thermal quenching.

Pyrosilicates of the general formula $(AE)_2MgSi_2O_7:Eu^{2+}$ with AE=Ba, Sr, Ca are known as green-emitting compounds for use in pc-LEDs (J. Yan et al., *J. Mater. Chem. C* 2, 2014, 8328). These pyrosilicates emit light with an emission maximum of 515 nm, and it has been proven to be difficult to shift the emission colour of these phosphors to shorter or longer wavelengths. Furthermore, the thermal quenching of these pyrosilicates is rather strong, e.g. with a $T_{50}$ of 460 K for $Ba_2MgSi_2O_7:Eu$ as disclosed in the publication cited above.

One object of the present invention is therefore to provide phosphors, which are excitable in the near-UV or violet region and which show a shift in emission colour with respect to the pyrosilicates mentioned above, in particular a bathochromic shift. It is important for the fine-tuning of the emission colour of pc-LEDs to have the choice of a variety of different phosphors showing different emission wavelengths and emission colours. A further object of the present invention is to provide phosphors with an improved thermal quenching behaviour with respect to the pyrosilicates mentioned above.

Surprisingly, it has been found that the pyrosilicate phosphors described below where luminescence is obtained from divalent europium ions or other dopants achieve this object. These phosphors can be excited in the near-UV and violet region and exhibit emission in the green part of the spectral region. The emission of the phosphor under excitation at 410 nm spans from 420-720 nm, with a peak maximum in the green spectral region around 515 nm, depending on the exact composition. The exact position of the emission maximum and the emission colour can be tuned by the presence of further elements in the phosphor. Furthermore, these materials show improved thermal quenching properties. The material is derived from a pyrosilicate structure of the composition $Ba_2MgSi_2O_7$.

The present invention relates to a compound of the following formula (1),

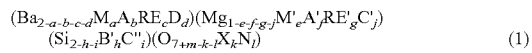

$$(Ba_{2-a-b-c-d}M_aA_bRE_cD_d)(Mg_{1-e-f-g-j}M'_eA'_fRE'_gC'_j)(Si_{2-h-i}B'_hC''_i)(O_{7+m-k-l}X_kN_l) \quad (1)$$

where the following applies to the symbols and indices used:

M is selected from the group consisting of Ca, Sr, Zn or mixtures of these elements;
A is selected from the group consisting of Na, K, Rb or mixtures of these elements;
RE is selected from the group consisting of La, Y, Gd or mixtures of these elements;
D is selected from the group consisting of $Eu^{2+}$, $Mn^{2+}$, $Yb^{2+}$, $Sm^{2+}$ or mixtures of these elements;
M' is selected from the group consisting of Zr, Hf or mixtures of these elements;
A' is selected from the group consisting of Li, Na or mixtures of these elements;
RE' is selected from the group consisting of Sc, Lu or mixtures of these elements;
C' is selected from the group consisting of B, Al, Ga, In or mixtures of these elements;
B' is selected from the group consisting of Ge, Sn or mixtures of these elements;
C'' is selected from the group consisting of B, Al, Ga, In or mixtures of these elements;
X is selected from the group consisting of F, Cl or mixtures of these elements;
N is nitrogen;
$0 \leq a \leq 1.0$;
$0 \leq b \leq 0.6$;
$0 \leq c \leq 0.6$;
$0 \leq d \leq 2.0$;
$0 \leq e \leq 0.3$;
$0 \leq f \leq 0.3$;
$0 \leq g \leq 0.3$;
$0 \leq j \leq 0.6$;
$0 \leq h \leq 1.0$;
$0 \leq i \leq 0.6$;
$0 \leq k \leq 2.1$;
$0 \leq l \leq 2.1$;
$-2.0 \leq m \leq 2.0$;

with the proviso that $b \neq 0$ and/or $c \neq 0$ and/or $e \neq 0$ and/or $g \neq 0$ and/or with the proviso that $f \neq 0$ and $k \neq 0$ at the same time and/or with the proviso that $f \neq 0$ and j and/or $i \neq 0$ at the same time.

By means of the proviso, the inventive compound necessarily comprises at least one of the elements A, RE, M' and/or RE', and/or it comprises the elements A' and X at the same time, and/or it comprises the elements A' and C' and/or C'' at the same time.

It is understood that the compound of formula (1) as well as the preferred embodiments is charge-neutral, i.e. the positive charges of the cationic elements of the lattice and the negative charges of the anionic elements of the lattice compensate each other.

Several charge compensation schemes are possible for the inventive compounds, such as intentional charge compensation via incorporation of several host-modifying co-dopants or host-self-compensation via e.g. oxygen vacancies ($V_O$) or interstitial oxygen atoms ($O_i$) in the lattice. The index m in formula (1), which can be a positive or a negative value, accounts for oxygen vacancies or interstitial oxygen atoms in the lattice.

When a monovalent cation is incorporated on a divalent site, this is followed by a simultaneous incorporation of a trivalent cation on the same site or the other divalent site or the tetravalent site in equivalent amount. For example, the incorporation of an alkaline metal A or A' can be compensated by the incorporation of an equivalent amount of a trivalent cation, such as aluminum. Alternatively a simultaneous incorporation of a halide anion can be done in an equivalent amount. Another possibility is the utilisation of host lattice self-compensation by having an oxygen anion vacancy.

When a trivalent cation is incorporated on a divalent site, this is followed by the simultaneous incorporation of another trivalent cation on the tetravalent site in equivalent amount. Another possibility is the use a trivalent nitride anion on a divalent oxygen site in an equivalent amount. Another possibility is the utilization of host lattice self-compensation by having an extra interstitial oxygen anion.

When a tetravalent cation is incorporated on a divalent site, this is followed by a simultaneous incorporation of a trivalent cation on a tetravalent site and additionally a nitride anion on an oxygen site and the simultaneous incorporation of interstitial oxygen atoms.

In a preferred embodiment of the invention, the following applies for the index a: $0 \leq a \leq 0.6$, more preferably $0 \leq a \leq 0.4$.

In a further preferred embodiment of the invention, the following applies for the index b: $0 \leq b \leq 0.4$, more preferably $0 \leq b \leq 0.2$. For compounds with $b \neq 0$, which contain the element A, the following applies preferably for the index b: $0.001 \leq b \leq 0.4$, more preferably $0.01 \leq b \leq 0.2$.

In a further preferred embodiment of the invention, the following applies for the index c: $0 \leq c \leq 0.4$, more preferably $0 \leq c \leq 0.2$. For compounds with $c \neq 0$, which contain the element RE, the following applies preferably for the index c: $0.001 \leq c \leq 0.4$, more preferably $0.01 \leq c \leq 0.2$.

In a further preferred embodiment of the invention, the following applies for the index d: $0 \leq d \leq 1.0$, more preferably $0.001 \leq d \leq 0.4$, even more preferably $0.005 \leq d \leq 0.2$, most preferably $0.01 \leq d \leq 0.2$.

In a further preferred embodiment of the invention, the following applies for the index e: $0 \leq e \leq 0.2$, more preferably $0 \leq e \leq 0.1$. For compounds with $e \neq 0$, which contain the element M', the following applies preferably for the index e: $0.001 \leq e \leq 0.2$, more preferably $0.01 \leq e \leq 0.1$.

In a further preferred embodiment of the invention, the following applies for the index f: $0 \leq f \leq 0.2$, more preferably $0 \leq f \leq 0.1$. For compounds with $f \neq 0$, which contain the element A', the following applies preferably for the index f: $0.001 \leq f \leq 0.2$, more preferably $0.01 \leq f \leq 0.1$. At the same time, preferably $k=f$; or at the same time $j=f$. However, if the compound furthermore comprises a trivalent cation C", i.e. if $i \neq 0$, it is also possible that $j > f$, e.g. in this case j can be $f+i$.

In a further preferred embodiment of the invention, the following applies for the index g: $0 \leq g \leq 0.2$, more preferably $0 \leq g \leq 0.1$. For compounds with $g \neq 0$, which contain the element RE', the following applies preferably for the index g: $0.001 \leq g \leq 0.2$, preferably $0.01 \leq g \leq 0.1$.

In a further preferred embodiment of the invention, the following applies for the index j: $0 \leq j \leq 0.4$, more preferably $0 \leq j \leq 0.2$.

In a further preferred embodiment of the invention, the following applies for the index h: $0 \leq h \leq 0.6$, more preferably $0 \leq h \leq 0.4$.

In a further preferred embodiment of the invention, the following applies for the index i: $0 \leq i \leq 0.4$, more preferably $0 \leq i \leq 0.2$.

In a further preferred embodiment of the invention, the following applies for the index k: $0 \leq k \leq 1.4$, more preferably $0 \leq k \leq 0.7$.

In a further preferred embodiment of the invention, the following applies for the index l: $0 \leq l \leq 1.4$, more preferably $0 \leq l \leq 0.7$.

In a further preferred embodiment of the invention, the following applies for the index m: $-1.0 \leq m \leq 1.0$, more preferably $-0.5 \leq m \leq 0.5$.

In a particularly preferred embodiment of the invention, the preferred ranges disclosed above apply simultaneously. It is therefore preferred when:
$0 \leq a \leq 0.6$;
$0 \leq b \leq 0.4$;
$0 \leq c \leq 0.4$;
$0.001 \leq d \leq 1.0$;
$0 \leq e \leq 0.2$;
$0 \leq f \leq 0.2$;
$0 \leq g \leq 0.2$;
$0 \leq j \leq 0.4$;
$0 \leq h \leq 0.6$;
$0 \leq i \leq 0.4$;
$0 \leq k \leq 1.4$; and
$0 \leq l \leq 1.4$;
$-1.0 \leq m \leq 1.0$;
with the proviso that $b \neq 0$ and/or $c \neq 0$ and/or $e \neq 0$ and/or $g \neq 0$ and/or with the proviso that $f \neq 0$ and $k \neq 0$ at the same time and/or with the proviso that $f \neq 0$ and j and/or $i \neq 0$ at the same time.

Furthermore, it is particularly preferred when:
$0 \leq a \leq 0.4$;
$0 \leq b \leq 0.2$;
$0 \leq c \leq 0.2$;
$0.005 \leq d \leq 0.4$, more preferably $0.01 \leq d \leq 0.2$;
$0 \leq e \leq 0.1$;
$0 \leq f \leq 0.1$;
$0 \leq g \leq 0.1$;
$0 \leq j \leq 0.2$;
$0 \leq h \leq 0.4$;
$0 \leq i \leq 0.2$;
$0 \leq k \leq 0.7$;
$0 \leq l \leq 0.7$;
$-0.5 \leq m \leq 0.5$;
with the proviso that $b \neq 0$ and/or $c \neq 0$ and/or $e \neq 0$ and/or $g \neq 0$ and/or with the proviso that $f \neq 0$ and $k \neq 0$ at the same time and/or with the proviso that $f \neq 0$ and j and/or $i \neq 0$ at the same time.

It is preferred that a maximum of three of the indices a, b, c, e, f, g, j, h, I, k and l is $\neq 0$, and it is particularly preferred that a maximum of two of the indices a, b, c, e, f, g, j, h, I, k and l is $\neq 0$.

When the compound of formula (1) contains more than one of the elements M, the ratio of Ca, Sr and Zn can be freely adjusted. It is preferred that the compound of formula (1) contains not more than one of the elements M. Particularly preferred elements M are Ca or Sr.

When the compound of formula (1) contains more than one of the elements A, the ratio of Na, K and Rb can be freely adjusted. It is preferred that the compound of formula (1) contains not more than one of the elements A. A particularly preferred element A is K.

When the compound of formula (1) contains more than one of the elements RE, the ratio of La, Y and Gd can be freely adjusted. It is preferred that the compound of formula (1) contains not more than one of the elements RE. A particularly preferred element RE is La.

When the compound of formula (1) contains more than one of the elements D, the ratio of Eu, Mn, Yb and Sm can be freely adjusted. It is preferred that the compound of formula (1) contains not more than one of the elements D. A particularly preferred element D is Eu.

When the compound of formula (1) contains more than one of the elements M', the ratio of Zr and Hf can be freely adjusted. It is preferred that the compound of formula (1) contains not more than one of the elements M'. A particularly preferred element M' is Zr.

When the compound of formula (1) contains more than one of the elements A', the ratio of Li and Na can be freely adjusted. It is preferred that the compound of formula (1) contains not more than one of the elements A'. A particularly preferred element A' is Li. This is in particular the case for compounds that contain F at the same time for charge compensation or for compounds that contain Al at the same time for charge compensation.

When the compound of formula (1) contains more than one of the elements RE', the ratio of Sc and Lu can be freely adjusted. It is preferred that the compound of formula (1) contains not more than one of the elements RE'. A particularly preferred element RE' is Sc.

When the compound of formula (1) contains more than one of the elements C', the ratio of B, Al, Ga and In can be freely adjusted. It is preferred that the compound of formula (1) contains not more than one of the elements C'. Particularly preferred elements C' are Al or Ga.

When the compound of formula (1) contains more than one of the elements B', the ratio of Ge and Sn can be freely adjusted. It is preferred that the compound of formula (1) contains not more than one of the elements B'. A particularly preferred element B' is Ge.

When the compound of formula (1) contains more than one of the elements C", the ratio of B, Al, Ga and In can be freely adjusted. It is preferred that the compound of formula (1) contains not more than one of the elements C". Particularly preferred elements C" are Al or Ga.

When the compound of formula (1) contains more than one of the elements X, the ratio of F and Cl can be freely adjusted. It is preferred that the compound of formula (1) contains not more than one of the elements X, i.e. it contains preferably either F or Cl, but no mixture of F and Cl.

In a preferred embodiment of the present invention, the preferences for the above-mentioned elements occur at the same time. Preferred embodiments of the compounds of formula (1) are therefore the compounds of the following formula (2), $$(Ba_{2-a-b-c-d}M_aK_bLa_cEu_d)(Mg_{1-e-f-g-j}Zr_eLi_fSc_gC'_j)(Si_{2-h-i}Ge_hC''_i)(O_{7+m-k-l}X_kN_l) \quad (2)$$

where the following applies for the symbols and indices used:

M is selected from the group consisting of Ca, Sr or mixtures of these elements;
C' is selected from the group consisting of Al, Ga or mixtures of these elements;
C'' is selected from the group consisting of Al, Ga or mixtures of these elements;
X is selected from the group consisting of F, Cl or mixtures of these elements;
N is nitrogen;
$0 \leq a \leq 0.4$;
$0 \leq b \leq 0.2$;
$0 \leq c \leq 0.2$;
$0.005 \leq d \leq 0.4$, more preferably $0.01 \leq d \leq 0.2$;
$0 \leq e \leq 0.1$;
$0 \leq f \leq 0.1$;
$0 \leq g \leq 0.1$;
$0 \leq j \leq 0.2$;
$0 \leq h \leq 0.4$;
$0 \leq i \leq 0.2$;
$0 \leq k \leq 0.7$;
$0 \leq l \leq 0.7$;
$-0.5 \leq m \leq 0.5$;

with the proviso that $b \neq 0$ and/or $c \neq 0$ and/or $e \neq 0$ and/or $g \neq 0$ and/or with the proviso that $f \neq 0$ and $k \neq 0$ at the same time and/or with the proviso that $f \neq 0$ and $j$ and/or $i \neq 0$ at the same time.

Preferred embodiments of the compound of formula (1) are the compounds of the following formulae (3) to (13), $$(Ba_{2-b-d}A_bD_d)MgSi_2(O_{7-b}X_b) \quad (3)$$

$$(Ba_{2-b-d}A_bD_d)(Mg_{1-b}RE'_b)Si_2O_7 \quad (4)$$

$$(Ba_{2-b-d}A_bD_d)MgSi_2O_{7-0.5b} \quad (5)$$

$$(Ba_{2-c-d}RE_cD_d)MgSi_2(O_{7-c}N_c) \quad (6)$$

$$(Ba_{2-d}D_d)(Mg_{1-g}RE'_g)Si_2(O_{7-g}N_g) \quad (7)$$

$$(Ba_{2-d}D_d)(Mg_{1-e}M'_e)Si_2O_{7+e} \quad (8)$$

$$(Ba_{2-d-0.5e}D_d)(Mg_{1-e}M'_e)Si_2O_{7+0.5e} \quad (9)$$

$$(Ba_{2-d}D_d)(Mg_{1-f}A'_f)Si_2(O_{7-f}X_f) \quad (10)$$

$$(Ba_{2-d}D_d)(Mg_{1-2f}A'_fC'_f)Si_2O_7 \quad (11)$$

$$(Ba_{2-d}D_d)(Mg_{1-f}A'_f)(Si_{2-f}C''_f)O_7 \quad (12)$$

$$(Ba_{2-d}D_d)(Mg_{1-2e}M'_eRE'_e)Si_2(O_{7-e}N_e) \quad (13)$$

where the symbols and indices have the meanings given above and furthermore:
$b \neq 0$ in formula (3), (4) and (5),
$c \neq 0$ in formula (6),
$g \neq 0$ in formula (7),
$e \neq 0$ in formula (8) and (9),
$f \neq 0$ in formula (10), (11) and (12), and
$e \neq 0$ in formula (13).

Preferred compounds of the formulae (3) to (13) are the compounds of the following formulae (3a) to (13a), $$(Ba_{2-b-d}K_bEu_d)MgSi_2(O_{7-b}F_b) \quad (3a)$$

$$(Ba_{2-b-d}K_bEu_d)MgSi_2(O_{7-b}Cl_b) \quad (3b)$$

$$(Ba_{2-b-d}K_bEu_d)(Mg_{1-b}Sc_b)Si_2O_7 \quad (4a)$$

$$(Ba_{2-b-d}K_bEu_d)MgSi_2O_{7-0.5b} \quad (5a)$$

$$(Ba_{2-c-d}La_cEu_d)MgSi_2(O_{7-c}N_c) \quad (6a)$$

$$(Ba_{2-d}Eu_d)(Mg_{1-g}Sc_g)Si_2(O_{7-g}N_g) \quad (7a)$$

$$(Ba_{2-d}Eu_d)(Mg_{1-e}Zr_e)Si_2O_{7+e} \quad (8a)$$

$$(Ba_{2-d-0.5e}Eu_d)(Mg_{1-e}Zr'_e)Si_2O_{7+0.5e} \quad (9a)$$

$$(Ba_{2-d}Eu_d)(Mg_{1-f}Li_f)Si_2(O_{7-f}F_f) \quad (10a)$$

$$(Ba_{2-d}Eu_d)(Mg_{1-f}Li_f)Si_2(O_{7-f}Cl_f) \quad (10b)$$

$$(Ba_{2-d}Eu_d)(Mg_{1-2f}Li_fAl_f)Si_2O_7 \quad (11a)$$

$$(Ba_{2-d}Eu_d)(Mg_{1-2f}Li_fGa_f)Si_2O_7 \quad (11b)$$

$$(Ba_{2-d}Eu_d)(Mg_{1-f}Li_f)(Si_{2-f}Al_f)O_7 \quad (12a)$$

$$(Ba_{2-d}Eu_d)(Mg_{1-f}Li_f)(Si_{2-f}Ga_f)O_7 \quad (12b)$$

$$(Ba_{2-d}Eu_d)(Mg_{1-2e}Zr_eSc_e)Si_2(O_{7-e}N_e) \quad (13a)$$

where the symbols and indices have the meanings given above and furthermore:
$b \neq 0$ in formula (3a), (3b), (4a) and (5a),
$c \neq 0$ in formula (6a),
$g \neq 0$ in formula (7a),
$e \neq 0$ in formula (8a) and (9a),
$f \neq 0$ in formula (10a), (10b), (11a), (11 b), (12a) and (12b), and
$e \neq 0$ in formula (13a).

The following compositions are examples of the phosphors according to formula (1) as well as the preferred embodiments:

$Ba_{1.85}Eu_{0.1}K_{0.05}Mg_{0.95}Sc_{0.05}Si_2O_7$
$Ba_{1.9}Eu_{0.1}\ Mg_{0.96}Sc_{0.04}Si_2O_{6.96}N_{0.04}$
$Ba_{1.8}Eu_{0.1}\ La_{0.1}\ MgSi_2O_{6.9}N_{0.1}$
$Ba_{1.9}Eu_{0.1}\ Mg_{0.95}Li_{0.05}Si_2O_{6.95}F_{0.05}$
$Ba_{1.9}Eu_{0.1}Zr_{0.05}Mg_{0.95}Si_2(O_7+0.05O_i)$
$Ba_{1.85}Eu_{0.1}K_{0.05}MgSi_2(O_7+0.025V_O)$
$Ba_{1.9}Eu_{0.1}\ Zr_{0.05}Mg_{0.9}Sc_{0.05}Si_2O_7N_{0.05}$.

The present invention furthermore relates to a process for the preparation of a compound of the formula (1) or the preferred embodiments, comprising the steps:

a) preparation of a mixture comprising all elements, which should be incorporated into the inventive compound; and
b) calcination of the mixture at elevated temperature.

Preferably, the compounds are prepared by mixing barium-, silicon- and europium-containing compounds (preferably oxides, carbonates or oxalates) with materials containing the further elements to be present in the inventive compound (likewise preferably oxides, carbonates or oxalates), in general with addition of at least one further inorganic or organic substance, which is usually employed as fluxing agent, and thermal treatment of the mixture. The oxides or carbonates of each of europium, silicon, barium, strontium, magnesium, zinc and/or calcium are particularly preferably employed in each case.

The calcination (=thermal treatment) reaction in step b) is usually carried out at a temperature above 900° C., preferably between 1000 and 1200° C. and particularly preferably between 1050 and 1150° C.

The said calcination is preferably carried out at least partly under reducing conditions. The reducing conditions are established, for example, using carbon monoxide, forming gas or hydrogen (reducing conditions) or at least by means of vacuum or an oxygen-deficiency atmosphere (partially reducing conditions). A reducing atmosphere is preferably established by means of a nitrogen/hydrogen atmosphere and particularly preferably in a stream of $N_2/H_2$ (preferably in the range between 95:5 and 30:70).

The fluxing agents optionally employed are preferably at least one substance from the group of ammonium halides, in particular ammonium chloride, alkaline-earth metal fluorides, such as calcium fluoride, strontium fluoride or barium fluoride, carbonates, in particular ammonium hydrogencarbonate, various alkoxides and/or oxalates and boric acid. It is also possible that parts of the fluxing agents remain in the final product, and the proportion thereof must therefore be included in the stoichiometric ratio of the components in the formula (1), respectively. Ammonium chloride, ammonium fluoride, boric acid ($H_3BO_3$), barium fluoride or combinations of these compounds are particularly preferably employed.

The compounds of the formula (1) are preferably prepared by a solid-state diffusion method as described above. However, processes are also known by means of which the phosphors can be prepared by wet-chemical methods from the corresponding inorganic and/or organic salts via a sol-gel process, co-precipitation process and/or drying process. Any of these methods to prepare the compounds of the formula (1) can be used as an alternative to the solid-state diffusion method.

The ratio of the elements in the mixture in step a) of the process according to the invention arises from the desired stoichiometry of the reaction product, i.e. the starting materials are preferably employed in accordance with the desired ratio in the product.

The mixture in step a) is preferably prepared in a mortar or on a rolling bench. This process can be performed in a solvent, such as acetone or an alcohol, in particular ethanol, propanol or isopropanol. On an industrial scale, the mixture in step a) is preferably prepared in an automatic mortar mill or on a rolling bench.

If the mixture is prepared in a solvent, it is dried before the calcination. This is preferably carried out in air, initially at room temperature and then in a drying cabinet at elevated temperature, preferably at 60-120° C., in particular at about 80° C.

It is preferred for the compounds according to the invention to be comminuted, for example by grinding in a mortar, after the calcination step.

The average particle size $d_{50}$ of the volume distribution of the phosphors according to the invention for use in LEDs is usually between 50 nm and 30 μm, preferably between 1 μm and 20 μm. The particle size here is preferably determined by means of a Coulter counter measurement.

In still a further embodiment, the compounds according to the invention may be coated. Suitable for this purpose are all coating methods as are known to the person skilled in the art from the prior art and are used for phosphors. Suitable materials for the coating are, in particular, metal oxides and nitrides, in particular alkaline-earth metal oxides, such as $Al_2O_3$, and alkaline-earth metal nitrides, such as AlN, as well as $SiO_2$. The coating can be carried out here, for example, by fluidised-bed methods or by wet-chemical methods. Suitable coating methods are disclosed, for example, in JP 04-304290, WO 91/10715, WO 99/27033, US 2007/0298250, WO 2009/065480 and WO 2010/075908. The aim of the coating can on the one hand be higher stability of the phosphors, for example to air or moisture. However, the aim may also be improved coupling-in and -out of light through a suitable choice of the surface of the coating and the refractive indices of the coating material. As an alternative or in addition to an inorganic coating, the compounds may also be coated with organic materials, for example with siloxanes. This may have advantages with respect to the dispersibility in a resin during production of the LEDs.

The compounds according to the invention can be excited in the near-UV and/or violet spectral region, preferably at about 370-430 nm, and exhibit emission maxima in the green spectral region, depending on the exact composition. Depending on the dopant D, an additional emission peak in the red region is possible, e.g. if a combination of $Eu^{2+}$ and $Mn^{2+}$ or $Eu^{2+}$ and $Eu^{3+}$ is used as the dopant D.

In the context of this application, UV light denotes light whose emission maximum is ≤400 nm, near UV light denotes light whose emission maximum is between 370-400 nm, violet light denotes light whose emission maximum is between 401 and 430 nm, blue light denotes light whose emission maximum is between 431 and 470 nm, cyan-coloured light denotes light whose emission maximum is between 471 and 505 nm, green light denotes light whose emission maximum is between 506 and 560 nm, yellow light denotes light whose emission maximum is between 561 and 575 nm, orange light denotes light whose emission maximum is between 576 and 600 nm and red light denotes light whose emission maximum is between 601 and 700 nm.

The present invention again furthermore relates to the use of the compound according to the invention as phosphor or conversion phosphor, in particular for the partial or complete conversion of the near-UV or violet emission of a light-emitting diode into light having a longer wavelength.

The compounds according to the invention are also called phosphors or conversion phosphors in the following text.

The present invention therefore furthermore relates to an emission-converting material comprising a compound according to the invention. The emission-converting material may consist of the compound according to the invention and would in this case be equivalent to the term "conversion phosphor" defined above. It may also be preferred for the emission-converting material according to the invention also to comprise further conversion phosphors besides the compound according to the invention. In this case, the emission-converting material according to the invention preferably comprises a mixture of at least two conversion phosphors, preferably a mixture of three conversion phosphors, where at least one thereof is a compound according to the invention. It is particularly preferred for the three conversion phosphors to be phosphors which emit light of wavelengths which are in the blue, green and orange or red region of the spectrum. The inventive compounds are particularly useful as green emitting compounds.

The inventive compounds show very good thermal quenching behaviour. Furthermore, by the obligatory presence of at least one of the elements A, RE, M', RE', A'+X, A'+C' or A'+C", the inventive compounds furthermore show a shift in their emission maxima, in particular a bathochromic shift, with respect to the corresponding compounds according to the prior art, which do not contain these elements. This is a surprising effect as several modification of the most basic compounds of this family, $Ba_2MgSi_2O_7$:Eu, such as the corresponding compound with additional lithium, does not show a shift of emission colour for many modifications.

The compounds according to the invention give rise to good LED qualities. The LED quality is described here via conventional parameters, such as, for example, the colour rendering index (CRI), the correlated colour temperature (CCT), lumen equivalent or absolute lumen, or the colour point in CIE x and y coordinates.

The colour rendering index (CRI) is a dimensionless lighting quantity, familiar to the person skilled in the art, which compares the colour reproduction faithfulness of an artificial light source with that of sunlight or filament light sources (the latter two have a CRI of 100).

The correlated colour temperature (CCT) is a lighting quantity, familiar to the person skilled in the art, with the unit Kelvin. The higher the numerical value, the higher the blue content of the light and the colder the white light from an artificial radiation source appears to the observer. The CCT follows the concept of the black body radiator, whose colour temperature describes the so-called Planck curve in the CIE diagram.

The lumen equivalent is a lighting quantity, familiar to the person skilled in the art, with the unit lm/W which describes the magnitude of the photometric luminous flux in lumens of a light source at a certain radiometric radiation power with the unit watt. The higher the lumen equivalent, the more efficient a light source.

The lumen is a photometric lighting quantity, familiar to the person skilled in the art, which describes the luminous flux of a light source, which is a measure of the total visible radiation emitted by a radiation source. The greater the luminous flux, the brighter the light source appears to the observer.

CIE x and CIE y stand for the coordinates in the standard CIE colour chart (here standard observer 1931), familiar to the person skilled in the art, by means of which the colour of a light source is described.

All the quantities mentioned above can be calculated from the emission spectra of the light source by methods familiar to the person skilled in the art.

The excitability of the phosphors according to the invention extends over a broad range, which extends from about 300 nm to 440 nm, preferably 350 nm to about 420 nm. The maximum of the excitation curve of the phosphors according to the invention is usually at about 350 to 370 nm, depending on the exact composition. As these phosphors still show a strong absorbance in the region of 400 to 420 nm, they are highly suitable to be used with a near-UV or violet LED.

The present invention furthermore relates to a light source which comprises at least one primary light source and at least one compound according to the invention. The emission maximum of the primary light source here is usually in the range 350 nm to 420 nm, preferably 370 nm to about 420 nm, where the primary radiation is converted partly or fully into longer-wave radiation by the phosphor according to the invention.

In a preferred embodiment of the light source according to the invention, the primary light source is a luminescent indium aluminium gallium nitride, in particular of the formula $In_iGa_jAl_kN$, where $0 \leq i$, $0 \leq j$, $0 \leq k$, and $i+j+k=1$.

Possible forms of light sources of this type are known to the person skilled in the art. These can be light-emitting LED chips of various structure.

Corresponding light sources according to the invention are also known as light-emitting diodes or LEDs.

In a further preferred embodiment of the light source according to the invention, the primary light source is a luminescent arrangement based on ZnO, TCO (transparent conducting oxide) or SiC.

In a further preferred embodiment of the light source according to the invention, the primary light source is a near-UV or violet laser.

In a further preferred embodiment of the light source according to the invention, the primary light source is a source which exhibits electroluminescence and/or photoluminescence. The primary light source may furthermore also be a plasma or discharge source.

The phosphors according to the invention can be employed individually or as a mixture with the following phosphors, which are familiar to the person skilled in the art. As the inventive phosphors emit in the green region of the spectrum, they are preferably employed in combination with a phosphor emitting in the blue region of the spectrum and a further phosphor emitting in the red region of the spectrum.

Corresponding phosphors which are in principle suitable for mixtures are, for example:
$Ba_2SiO_4$:$Eu^{2+}$, $BaSi_2O_5$:$Pb^{2+}$, $Ba_xSr_{1-x}F_2$:$Eu^{2+}$, $BaSrMgSi_2O_7$:$Eu^{2+}$, $BaTiP_2O_7$, $(Ba,Ti)_2P_2O_7$:Ti, $Ba_3WO_6$:U, $BaY_2F_8$:$Er^{3+}$,$Yb^+$, $Be_2SiO_4$:$Mn^{2+}$, $Bi_4Ge_3O_{12}$, $CaAl_2O_4$:$Ce^{3+}$, $CaLa_4O_7$:$Ce^{3+}$, $CaAl_2O_4$:$Eu^{2+}$, $CaAl_2O_4$:$Mn^{2+}$, $CaAl_4O_7$:$Pb^{2+}$,$Mn^{2+}$, $CaAl_2O_4$:$Tb^{3+}$, $Ca_3Al_2Si_3O_{12}$:$Ce^{3+}$, $Ca_3Al_2Si_3Oi_2$:$Ce^{3+}$, $Ca_3Al_2Si_3O_2$:$Eu^{2+}$, $Ca_2B_5O_9Br$:$Eu^{2+}$, $(Ca_{1-x}Sr_x)AlSi(N,O)_3$:Eu, $Ca_2B_5O_9Cl$:$Eu^{2+}$, $Ca_2B_5O_9Cl$:$Pb^{2+}$, $CaB_2O_4$:$Mn^{2+}$, $Ca_2B_2O_5$:$Mn^{2+}$, $CaB_2O_4$:$Pb^{2+}$, $CaB_2P_2O_9$:$Eu^{2+}$, $Ca_5B_2SiO_{10}$:$Eu^{3+}$, $Ca_{0.5}Ba_{0.5}Al_{12}O_{19}$:$Ce^{3+}$,$Mn^{2+}$, $Ca_2Ba_3(PO_4)_3Cl$:$Eu^{2+}$, $CaCl_2$:$Eu^{2+}$,$Mn^{2+}$ in $SiO_2$, $CaF_2$:$Ce^{3+}$, $CaF_2$:$Ce^{3+}$,$Mn^{2+}$, $CaF_2$:$Ce^{3+}$,$Tb^{3+}$, $CaF_2$:$Eu^{2+}$, $CaF_2$:$Mn^{2+}$, $CaGa_2O_4$:$Mn^{2+}$, $CaGa_4O_7$:$Mn^{2+}$, $CaGa_2S_4$:$Ce^{3+}$, $CaGa_2S_4$:$Eu^{2+}$, $CaGa_2S_4$:$Mn^{2+}$, $CaGa_2S_4$:$Pb^{2+}$, $CaGeO_3$:$Mn^{2+}$, $CaI_2$:$Eu^{2+}$, $CaLaBO_4$:$Eu^{3+}$, $CaLaB_3O_7$:$Ce^{3+}$,$Mn^{2+}$, $Ca_2La_2BO_{6.5}$:$Pb^{2+}$, $Ca_2MgSi_2O_7$, $Ca_2MgSi_2O_7$:$Ce^{3+}$, $CaMgSi_2O_6$:$Eu^{2+}$, $Ca_3MgSi_2O_8$:$Eu^{2+}$, $Ca_2MgSi_2O_7$:$Eu^{2+}$, $CaMgSi_2O_6$:$Eu^{2+}$,$Mn^{2+}$, $Ca_2MgSi_2O_7$:$Eu^{2+}$,$Mn^{2+}$, $CaMoO_4$, $CaMoO_4$:$Eu^{3+}$, $CaO$:$Bi^{3+}$, $CaO$:$Cd^{2+}$, $CaO$:$Cu^+$, $CaO$:$Eu^{3+}$, $CaO$:$Eu^{3+}$, $Na^+$, $CaO$:$Mn^{2+}$, $CaO$:$Pb^{2+}$, $CaO$:$Sb^{3+}$, $CaO$:$Sm^{3+}$, $CaO$:$Tb^{3+}$, $CaO$:$Zn^{2+}$, $Ca_2P_2O_7$:$Ce^{3+}$, $\alpha$-$Ca_3(PO_4)_2$:$Ce^{3+}$, $\beta$-$Ca_3(PO_4)_2$:$Ce^{3+}$, $Ca_5(PO_4)_3Cl$:$Eu^{2+}$, $Ca_5(PO_4)_3Cl$:$Mn^{2+}$, $Ca_5(PO_4)_3Cl$:$Sb^{3+}$, $Ca_5(PO_4)_3Cl$:$Sn^{2+}$, $\beta$-$Ca_3(PO_4)_2$:$Eu^{2+}$,$Mn^{2+}$, $Ca_5(PO_4)_3F$:$Mn^{2+}$, $Ca_5(PO_4)_3F$:$Sb^{3+}$, $Ca_5(PO_4)_3F$:$Sn^{2+}$, $\alpha$-$Ca_3(PO_4)_2$:$Eu^{2+}$, $\beta$-$Ca_3(PO_4)_2$:$Eu^{2+}$, $Ca_2P_2O_7$:$Eu^{2+}$, $Ca_2P_2O_7$:$Eu^{2+}$,$Mn^{2+}$, $CaP_2O_6$:$Mn^{2+}$, $\alpha$-$Ca_3(PO_4)_2$:$Pb^{2+}$, $\alpha$-$Ca_3(PO_4)_2$:$Sn^{2+}$, $\beta$-$Ca_3(PO_4)_2$:$Sn^{2+}$, $\beta$-$Ca_2P_2O_7$:Sn,Mn, $CaS$:$Bi^{3+}$, $CaS$:$Bi^{3+}$, Na, $CaS$:$Ce^{3+}$, $CaS$:$Eu^{2+}$, $CaS$:Cu+,Na+, $CaS$:$La^{3+}$, $CaS$:$Mn^{2+}$, $CaSO_4$:Bi, $CaSO_4$:$Ce^{3+}$, $CaSO_4$:$Ce^{3+}$,$Mn^{2+}$, $CaSO_4$:$Eu^{2+}$, $CaSO_4$:$Eu^{2+}$,$Mn^{2+}$, $CaSO_4$:$Pb^{2+}$, $CaS$:$Pb^{2+}$, $CaS$:$Pb^{2+}$,Cl, $CaS$:$Pb^{2+}$,$Mn^{2+}$, $CaS$:$Pr^{3+}$,$Pb^{2+}$,Cl, $CaS$:$Sb^{3+}$, $CaS$:$Sb^{3+}$,Na, $CaS$:$Sm^{3+}$, $CaS$:$Sn^{2+}$, $CaS$:$Sn^{2+}$,F, $CaS$:$Tb^{3+}$, $CaS$:$Tb^{3+}$,Cl, $CaSiO_3$:$Ce^{3+}$, $Ca_3SiO_4Cl_2$:$Eu^{2+}$, $Ca_3SiO_4Cl_2$:$Pb^{2+}$, $CaSiO_3$:$Eu^{2+}$, $CaSiO_3$:$Mn^{2+}$,Pb, $CaSiO_3$:$Pb^{2+}$, $CaSiO_3$:$Pb^{2+}$,$Mn^{2+}$, $CaSiO_3$:$Ti^{4+}$, $CaSr_2(PO_4)_2$:$Bi^{3+}$, $(Ca,Sr,Ba)(Mg_2SiN_4)$:Eu, $(Ca,Sr,Ba)(LiAl_3N_4)$:Eu, $\beta$-$(Ca,Sr)_3(PO_4)_2$:$Sn^{2+}$ $Mn^{2+}$, $CaTi_{3.9}Al_{0.1}O_3$:$Bi^{3+}$, $CaTiO_3$:$Eu^{3+}$, $CaTiO_3$:$Pr^{3+}$, $Ca_5(VO_4)_3Cl$, $CaWO_4$, $CaWO_4$:$Pb^{2+}$, $CaWO_4$:W, $Ca_3WO_6$:U, $CaYAlO_4$:$Eu^{3+}$, $CaYBO_4$:$Bi^{3+}$, $CaYBO_4$:$Eu^{3+}$, $CaYB_{0.8}O_{3.7}$:$Eu^{3+}$, $CaY_2ZrO_6$:$Eu^{3+}$, $(Ca,Zn,Mg)_3(PO_4)_2$:Sn, $CeF_3$, $(Ce,Mg)BaAl_{11}O_{18}$:Ce, $(Ce,Mg)SrAl_{11}O_{18}$:Ce, $CeMgAl_{11}O_{19}$:Ce;Tb, $Cd_2B_6O_{11}$:$Mn^{2+}$, $CdS$:$Ag^+$,Cr, $CdS$:In, $CdS$:In, $CdS$:In,Te, $CdS$:Te, $CdWO_4$, CsF, CsI, $CsI$:$Na^+$, CsI:Tl, $(ErCl_3)_{0.25}(BaCl_2)_{0.75}$, GaN:Zn, $Gd_3Ga_5O_{12}$:$Cr^{3+}$, $Gd_3Ga_5O_{12}$:Cr,Ce, $GdNbO_4$:$Bi^{3+}$, $Gd_2O_2S$:$Eu^{3+}$, $Gd_2O_2Pr^{3+}$, $Gd_2O_2S:Pr,Ce,F$, $Gd_2O_2S:Tb^{3+}$, $Gd_2SiO_5:Ce^{3+}$, $KGa_{11}O_{17}:Mn^{2+}$, $K_2La_2Ti_3O_{10}:Eu$, $KMgF_3:Eu^{2+}$, $KMgF_3:Mn^{2+}$, $K_2(Si,Ti)F_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La,Ce,Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBaP_2O_7:Eu^{2+}$, $MgBaP_2O_7:Eu^{2+},Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+},Mn^2$, $MgCeAl_xO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $Na_{1.23}K_{0.42}Eu_{0.12}TiSi_4O_{11}:Eu^{3+}$, $Na_{1.23}K_{0.42}Eu_{0.12}TiSi_5O_{13}XH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$, $NaYF_4:Er^{3+},Yb^{3+}$, $NaYO_2:Eu^{3+}$, $P46(70\%)+P47$ (30%), $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}$ (F,Cl,Br), $SrB_4O_7:Pb^{2+}$, $SrB_4O_7:Pb^{2+},Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $SrFBO:E^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO.3B_2O_3:Eu^{2+},Cl$, $\beta$-$SrO.3B_2O_3:Pb^{2+}$, $\beta$-SiAlON, $\beta$-$SrO.3B_2O_3:Pb^{2+},Mn^{2+}$, $\alpha$-$SrO.3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+}$, $Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $\beta$-$Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta$-$Sr_3(PO_4)_2:Sn^{2+}$, $\beta$-$Sr_3(PO_4)_2:Sn^{2+},Mn^{2+}$ (Al), $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+}$, $Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3:Pr^{3+},Al^{3+}$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+},Tb^{3+}$, $YAl_3B_4O_{12}:Eu^{3+}$, $YAl_3B_4O_{12}:Eu^{3+}$, $Cr^{3+}$, $YAl_3B_4O_{12}:Th^{4+},Ce^{3+},Mn^{2+}$, $YAlO_3:Ce^{3+}$, $Y_3Al_5O_{12}:Ce^{3+}$, $(Lu,Y,Gd,Tb)_3(Al,Ga)_5(O,N)_{12}$, $Y_3Al_5O_{12}:Cr^{3+}$, $YAlO_3:Eu^{3+}$, $Y_3Al_5O_{12}:Eu^{3r}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+},Yb^{3+}$, $YF_3:Mn^{2+}$, $YF_3:Mn^{2+},Th^{4+}$, $YF_3:Tm^{3+},Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBr:Eu^{3+}$, $Y_2O_3:Ce$, $Y_2O_3:Er^{3+}$, $Y_2O_3:Eu^{3+}$ (YOE), $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+}$, $Ga^{3+}$, $ZnO:Bi^{3+}$, $ZnO:Ga^{3+}$, $ZnO:Ga$, $ZnO$—$CdO:Ga$, $ZnO:S$, $ZnO:Se$, $ZnO:Zn$, $ZnS:Ag^+,Cl^-$, $ZnS:Ag,Cu,Cl$, $ZnS:Ag,Ni$, $ZnS:Au,In$, $ZnS$—$CdS$ (25-75), $ZnS$—$CdS$ (50-50), $ZnS$—$CdS$ (75-25), $ZnS$—$CdS:Ag,Br,Ni$, $ZnS$—$CdS:Ag^+,Cl$, $ZnS$—$CdS:Cu,Br$, $ZnS$—$CdS:Cu,I$, $ZnS:Cl^-$, $ZnS:Eu^{2+}$, $ZnS:Cu$, $ZnS:Cu^+$, $Al^{3+}$, $ZnS:Cu^+,Cl^-$, $ZnS:Cu,Sn$, $ZnS:Eu^{2+}$, $ZnS:Mn^{2+}$, $ZnS:Mn,Cu$, $ZnS:Mn^{2+},Te^{2+}$, $ZnS:P$, $ZnS:P^{3-},Cl^-$, $ZnS:Pb^{2+}$, $ZnS:Pb^{2+},Cl^-$, $ZnS:Pb,Cu$, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, $ZnS:Sn,Ag$, $ZnS:Sn^{2+}$, $Li^+$, $ZnS:Te,Mn$, $ZnS$—$ZnTe:Mn^{2+}$, $ZnSe:Cu^+,Cl$ and $ZnWO_4$.

The phosphors or phosphor combinations according to the invention can either be dispersed in a resin, for example epoxy or silicone resin, or, in the case of suitable size ratios, arranged directly on the primary light source or alternatively arranged remote therefrom, depending on the application (the latter arrangement also includes "remote phosphor technology"). The advantages of remote phosphor technology are known to the person skilled in the art and are revealed, for example, by the following publication: Japanese J. of Appl. Phys. Vol. 44, No. 21 (2005), L649-L651.

In a further embodiment, it is preferred for the optical coupling between the phosphor and the primary light source to be achieved by a light-conducting arrangement. This makes it possible for the primary light source to be installed at a central location and to be optically coupled to the phosphor by means of light-conducting devices, such as, for example, optical fibres. In this way, it is possible to achieve lamps adapted to the lighting wishes which merely consist of one or different phosphors, which can be arranged to form a light screen, and an optical waveguide, which is coupled to the primary light source. In this way, it is possible to place a strong primary light source at a location which is favourable for electrical installation and to install lamps comprising phosphors which are coupled to the optical waveguides at any desired locations without further electrical cabling, but instead only by laying optical waveguides.

The invention furthermore relates to a lighting unit, in particular for the backlighting of display devices, characterised in that it comprises at least one light source according to the invention, and to a display device, in particular liquid-crystal display device (LC display), with backlighting, characterised in that it comprises at least one lighting unit according to the invention.

For use in LEDs, the phosphors can also be converted into any desired outer shapes, such as spherical particles, platelets and structured materials and ceramics. These shapes are in accordance with the invention summarised under the term "shaped bodies". The shaped body is preferably a "phosphor body". The present invention thus furthermore relates to a shaped body comprising the phosphors according to the invention. The production and use of corresponding shaped bodies are familiar to the person skilled in the art from numerous publications.

It is also advantageous to use the phosphors according to the invention in the form of translucent ceramics, since the optical path length, i.e. the thickness of the ceramic layer, in ceramic luminescence conversion screens can be increased owing to the reduced scattering compared with a powder layer. The present invention therefore furthermore relates to a ceramic comprising at least one compound according to the invention. The ceramic may then consist only of the compound according to the invention. However, it may also comprise matrix materials and/or further phosphors. Suitable matrix materials are, for example, $SiO_2$, $Y_2O_3$ or $Al_2O_3$.

The compounds according to the invention have the following advantageous properties:
1) The compounds according to the invention have a very good thermal quenching behaviour. In particular, the thermal quenching is considerably improved with respect to $Ba_2MgSi_2O_7$:Eu according to the prior art.
2) The compounds according to the invention show little or no absorption in the blue region of the spectrum and are therefore highly suitable for use in LEDs using a violet or near-UV LED as the primary light source.
3) The compounds according to the invention exhibit green emission with shifted emission compared to $Ba_2MgSi_2O_7$:Eu.
4) The compounds according to the invention have high chemical stability, in particular when they contain a coating.

All variants of the invention described here can be combined with one another so long as the respective embodiments are not mutually exclusive. In particular, it is an obvious operation, on the basis of the teaching of this specification, as part of routine optimisation, precisely to combine various variants described here in order to obtain a specific particularly preferred embodiment. The following examples are intended to illustrate the present invention and show, in particular, the result of such illustrative combinations of the invention variants described. However, they should in no way be regarded as limiting, but instead are intended to stimulate generalisation. All compounds or components which are used in the preparations are either known and commercially available or can be synthesised by known methods. The temperatures indicated in the examples are always in ° C. It furthermore goes without saying that, both in the description and also in the examples, the amounts of the components added in the compositions always add up to a total of 100%. Percent data should always be regarded in the given connection.

EXAMPLES

The phase formation of the samples was in each case checked by means of X-ray diffractometry. For this purpose, a Rigaku Miniflex II X-ray diffractometer with Bragg-Brentano geometry was used. The radiation source used was an X-ray tube with Cu-Kα radiation ($\lambda$=0.15418 nm). The tube was operated at a current strength of 15 mA and a voltage of 30 kV. The measurement was carried out in an angle range of 10-80° at 10°·min⁻.

Reflection spectra were determined using an Edinburgh Instruments Ltd. fluorescence spectrometer. For this purpose, the samples were placed and measured in a $BaSO_4$-coated integrating sphere. Reflection spectra were recorded in a range from 250-800 nm. The white standard used was $BaSO_4$ (Alfa Aesar 99.998%). A 450 W Xe lamp was used as excitation source.

The excitation spectra and emission spectra were recorded using an Edinburgh Instruments Ltd. fluorescence spectrometer fitted with mirror optics for powder samples. The excitation source used was a 450 W Xe lamp.

Synthesis of Inventive Compounds

Example 1: Synthesis of $Ba_{1.90}Eu_{0.10}MgSi_2O_7$— Comparative Example 112.49 g $BaCO_3$
29.14 g $Mg_5(CO_3)_4(OH)_2$
5.28 g $Eu_2O_3$
37.20 g $SiO_2$
1.60 g $NH_4Cl$ The starting materials are mixed by ball milling for 2 hours and fired at 1100° C. for 6 h in an $H_2$:$N_2$ (70:30) atmosphere. After firing, the material is ground into a fine powder, washed in water, dried and sieved using a 50 m nylon sieve to narrow the particle size range. The resulting compound shows an emission maximum at 512 nm (CIE x=0.252; y=0.514).

Example 2: Synthesis of $Ba_{1.85}K_{0.05}Eu_{0.10}MgSi_2O_{6.95}Cl_{0.05}$ 14.60 g $BaCO_3$
0.15 g $K_2CO_3$x0.5$H_2O$
3.89 g $Mg_5(CO_3)_4(OH)_2$
0.70 g $Eu_2O_3$
4.96 g $SiO_2$
0.21 g $NH_4Cl$ The starting materials are mixed in a mechanical mortar for 20 minutes and fired at 1100° C. for 6 h in an $H_2$:$N_2$ (70:30) atmosphere. After firing, the material is ground into a fine powder, washed in water, dried and sieved using a 50 μm nylon sieve to narrow the particle size range. The resulting compound shows an emission maximum at 518 nm (CIE x=0.273; y=0.521).

Example 3: Synthesis of $Ba_{1.85}K_{0.05}Eu_{0.10}MgSi_2O_{6.95}F_{0.05}$ 14.60 g $BaCO_3$
0.12 g KF
3.89 g $Mg_5(CO_3)_4(OH)_2$
0.70 g $Eu_2O_3$
4.96 g $SiO_2$
0.21 g $NH_4Cl$ The starting materials are mixed in a mechanical mortar for 20 minutes and fired at 1100° C. for 6 h in an $H_2$:$N_2$ (70:30) atmosphere. After firing, the material is ground into a fine powder, washed in water, dried and sieved using a 50 μm nylon sieve to narrow the particle size range. The resulting compound shows an emission maximum at 516 nm (CIE x=0.260; y=0.520).

Example 4: Synthesis of $Ba_{1.90}Eu_{0.10}Mg_{0.95}Li_{0.05}Si_2O_{6.95}Cl_{0.05}$ 15.00 g $BaCO_3$
0.07 g $Li_2CO_3$
3.69 g $Mg_5(CO_3)_4(OH)_2$
0.70 g $Eu_2O_3$
4.96 g $SiO_2$
0.21 g $NH_4Cl$ The starting materials are mixed in a mechanical mortar for 20 minutes and fired at 1100° C. for 6 h in an $H_2$:$N_2$ (70:30) atmosphere. After firing, the material is ground into a fine powder, washed in water, dried and sieved using a 50 μm nylon sieve to narrow the particle size range. The resulting compound shows an emission maximum at 513 nm (CIE x=0.253; y=0.517).

Example 5: Synthesis of $Ba_{1.90}Eu_{0.10}Mg_{0.95}Li_{0.05}Si_2O_{6.95}F_{0.05}$ 15.00 g $BaCO_3$
0.07 g $Li_2CO_3$ 3.69 g $Mg_5(CO_3)_4(OH)_2$
0.70 g $Eu_2O_3$
4.96 g $SiO_2$
0.21 g $NH_4Cl$
0.21 g $BaF_2$ The starting materials are mixed in a mechanical mortar for 20 minutes and fired at 1100° C. for 6 h in an $H_2:N_2$ (70:30) atmosphere. After firing, the material is ground into a fine powder, washed in water, dried and sieved using a 50 μm nylon sieve to narrow the particle size range. The resulting compound shows an emission maximum at 518 nm (CIE x=0.272; y=0.528).

Example 6: Synthesis of $Ba_{1.90}Eu_{0.10}Mg_{0.80}Li_{0.1}Al_{0.1}Si_2O_7$ 15.00 g $BaCO_3$
0.15 g $Li_2CO_3$
3.11 g $Mg_5(CO_3)_4(OH)_2$
0.70 g $Eu_2O_3$
4.96 g $SiO_2$
0.21 g $NH_4Cl$
0.20 g $A_2O_3$ The starting materials are mixed in a mechanical mortar for 20 minutes and fired at 1100° C. for 6 h in an $H_2:N_2$ (70:30) atmosphere. After firing, the material is ground into a fine powder, washed in water, dried and sieved using a 50 μm nylon sieve to narrow the particle size range. The resulting compound shows an emission maximum at 521 nm (CIE x=0.289; y=0.527).

Example 7: Synthesis of $Ba_{1.9}Eu_{0.10}Mg_{0.95}Zr_{0.05}Si_2O_{7.05}$ 15.00 g $BaCO_3$
3.69 g $Mg_5(CO_3)_4(OH)_2$
0.70 g $Eu_2O_3$
4.96 g $SiO_2$
0.21 g $NH_4Cl$
0.25 g $ZrO_2$ The starting materials are mixed in a mechanical mortar for 20 minutes and fired at 1050° C. for 14 h in an $H_2:N_2$ (70:30) atmosphere. After firing, the material is ground into a fine powder, washed in water, dried and sieved using a 50 μm nylon sieve to narrow the particle size range. The resulting compound shows an emission maximum at 516 nm (x=0.260; y=0.515).

Example 8: Synthesis of $Ba_{1.90}Eu_{0.10}Mg_{0.95}Sc_{0.05}Si_2O_{7.025}$ 7.499 g $BaCO_3$
1.845 g $Mg_5(CO_3)_4(OH)_2$
0.352 g $Eu_2O_3$
2.463 g $SiO_2$
0.107 g $NH_4Cl$
0.069 g $Sc_2O_3$ The starting materials are mixed in a mechanical mortar for 20 minutes and fired at 1100° C. for 6 h in an $H_2:N_2$ (70:30) atmosphere. After firing, the material is ground into a fine powder, washed in water, dried and sieved using a 50 μm nylon sieve to narrow the particle size range. The resulting compound shows an emission maximum at 512 nm (CIE x=0.255, y=0.498).

Example 9: Synthesis of $Ba_{1.86}Eu_{0.10}La_{0.04}MgSi_2O_{7.02}$ 11.779 g $BaCO_3$
3.185 g $Mg_5(CO_3)_4(OH)_2$
0.577 g $Eu_2O_3$
4.040 g $SiO_2$
0.175 g $NH_4Cl$
0.214 g $La_2O_3$ The starting materials are mixed in a mechanical mortar for 20 minutes and fired at 1100° C. for 6 h in an $H_2:N_2$ (70:30) atmosphere. After firing, the material is ground into a fine powder, washed in water, dried and sieved using a 50 μm nylon sieve to narrow the particle size range. The resulting compound shows an emission maximum at 512 nm (CIE x=0.255, y=0.507).

Example 10: Thermal Quenching Behaviour

The thermal quenching behaviour of the inventive compounds was investigated by measuring the emission efficiency at 150° C. and comparing it to the efficiency at room temperature. The results are summarized in Table 1.

TABLE 1

| Thermal quenching behaviour | |
|---|---|
| Example | Efficiency at 150° C. (compared to r.t.) |
| $Ba_2MgSi_2O_7$: Eu * | 50% |
| 2 | 87% |
| 4 | 85% |
| 6 | 72% |
| 7 | 95% |

* value according to J. Van et al., *J. Mater. Chem.* C 2, 2014, 8328.

Example 11: LED Examples

General Instructions for Manufacturing and Measurement of Phosphor-Converted-LEDs (pc-LEDs):

A mass of $m_{p,n}$ (where the index n denotes the number of the phosphor component of the phosphor blend related to the particular LED-example), of the phosphor component mentioned in the particular LED-example, is weighed together with the other phosphor components (masses of $m_{p,n}$, n>1) and subsequently mixed (e. g. by use of a planetary centrifugal mixer). To the phosphor blend obtained by the process mentioned before, a mass of $m_{Silicone}$ of an optical transparent silicone is added and subsequently homogenously mixed by means of a planetary centrifugal mixer, in order to obtain a phosphor concentration of $c_p$ (in % by mass) in the whole mass of the Silicone-phosphor slurry. The slurry is then dispensed onto a blue or near-UV or UV- or violet-light-emitting LED-dye by means of an automated dispensing equipment and cured under elevated temperatures, depending on the properties of the used transparent Silicone. The LED-dyes used in the examples mentioned below emit visible violet light at a wavelength of 407 nm or 411 nm, respectively and are driven at an operating current of 350 mA. The lighting-technology-related parameters are obtained by means of a spectrometer from Instrument Systems, type CAS 140 CT combined with an Integration sphere ISP 250. The characterization of the pc-LED is performed by measurement of the wavelength-dependent spectral power density. The spectrum of the emitted light from the pc-LED is then used for the calculation of colour coordinates x and y (CIE 1931—2-degree observer), photometric fluxes $\Phi_v$, Correlated Colour Temperature (CCT) and the Colour Rendering Index (CRI).

TABLE 2

Phosphor components for LED manufacturing.

| Phosphor component no. | Phosphor designation |
|---|---|
| 1 | $Sr_{2.5}Eu_{0.12}Ca_{0.38}MgSi_2O_8$ |
| 2 | $Ba_{1.9}Eu_{0.1}Mg_{0.95}Zr_{0.05}Si_2O_{7.05}$* |
| 3 | $CaAlSiN_3$: Eu |

*according to Example 7

TABLE 3

LED manufacturing examples. Refer to Table 2 for the specific components.

| Parameter | LED example a | LED example b |
|---|---|---|
| peak-wavelength of LED dye | 407 | 410 |
| $m_{P,1}$/g | 1.52 | 1.52 |
| $m_{P,2}$/g | 3.05 | 3.05 |
| $m_{P,3}$/g | 0.23 | 0.23 |
| $m_{Silicone}$/g | 5.20 | 5.20 |
| $c_p$/wt. % | 48 | 48 |
| CIE x | 0.431 | 0.431 |
| CIE y | 0.408 | 0.400 |
| CCT/K | 3133 | 3076 |
| CRI | 89 | 89 |
| $\Phi_v$/lm | 41 | 41 |

Figure 1:
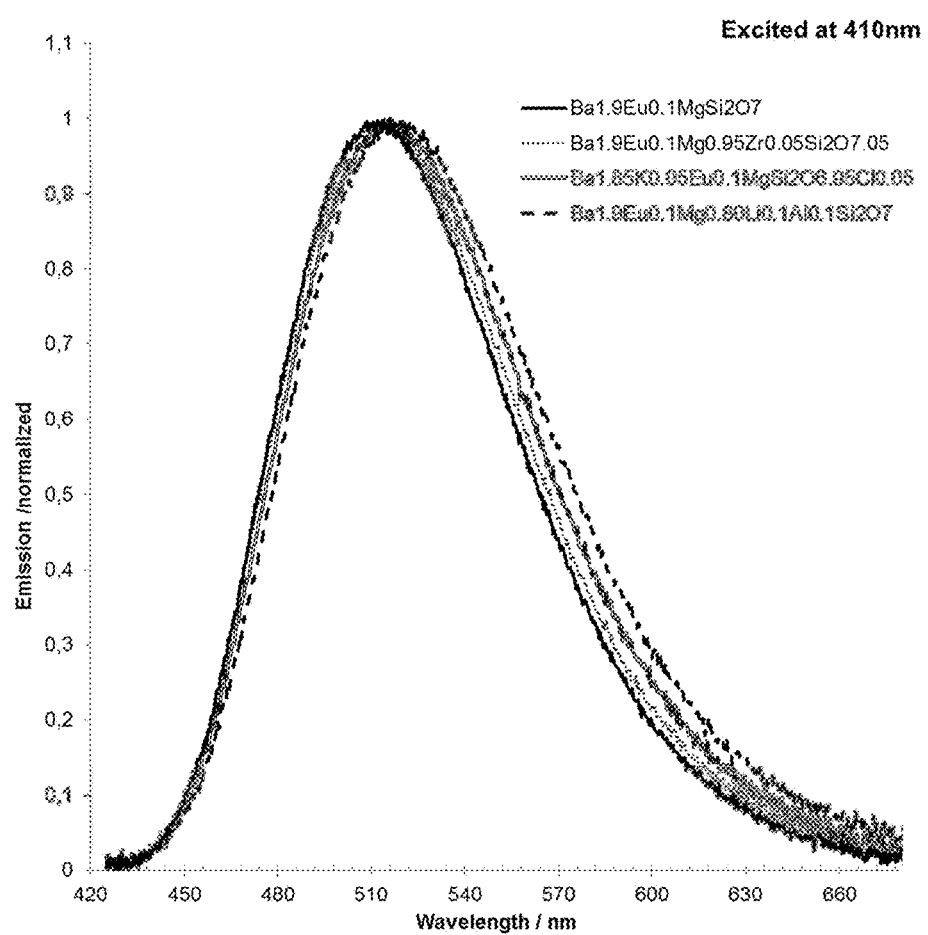
FIG. 1: Emission spectra of different Ba-pyrosilicate modifications under a 410 nm excitation, showing spectral shift of the emission band depending on composition compared to the inventive compound of Example 1.
Figure 2:
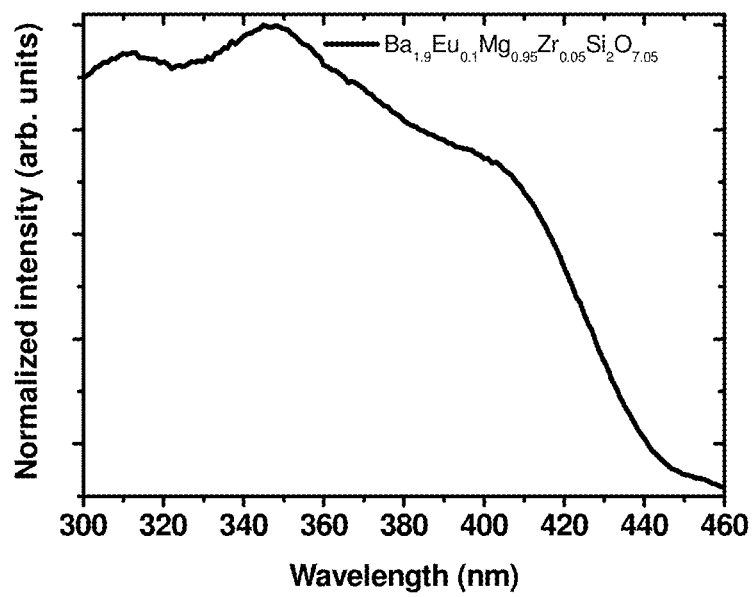
FIG. 2: Excitation spectrum of Ba-pyrosilicate modification of Example 7 monitoring the emission at 517 nm.
Figure 3:
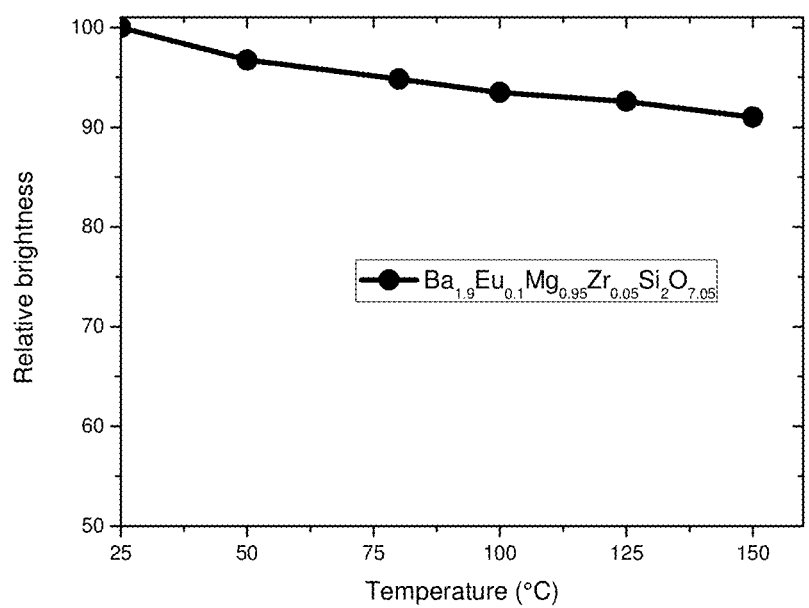
FIG. 3: Temperature quenching (TQ) profile of the typical modification of the Ba-pyrosilicate of Example 7 under 410 nm excitation (see Example 10 for comparison with the literature data).
Figure 4:
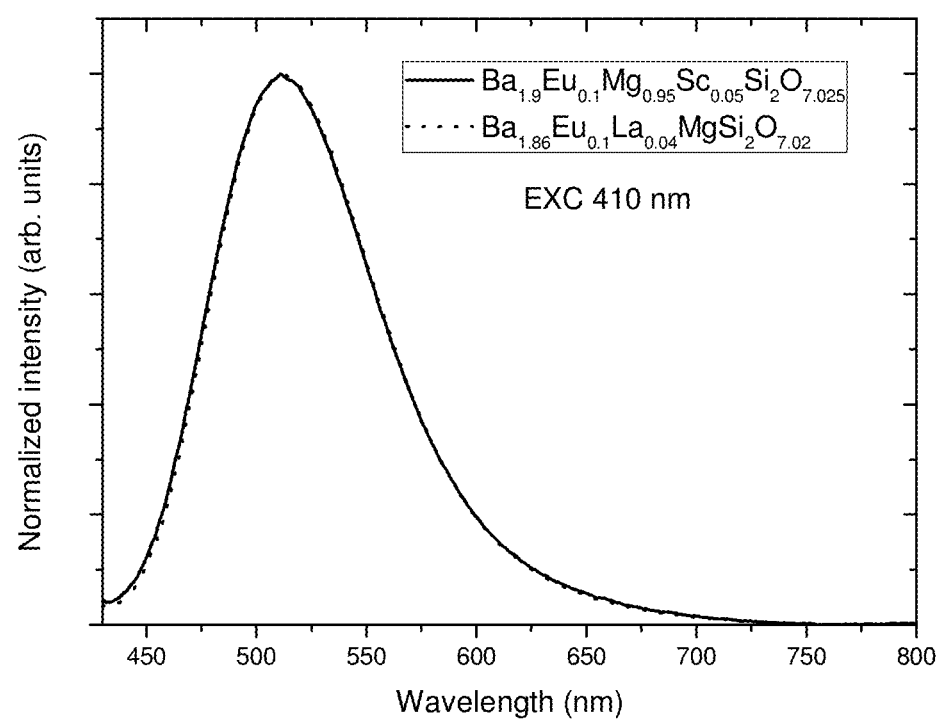
FIG. 4: Emission spectra of Sc- and La-modified Ba-pyrosilicate modifications according to Examples 8 and 9 under a 410 nm excitation (note: the spectra overlay each other almost perfectly).
Figure 5:
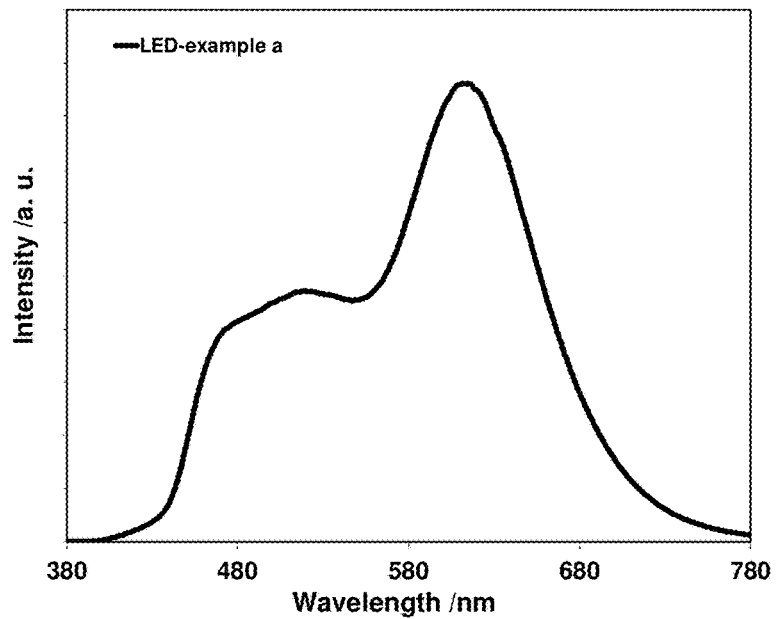
FIG. 5: Spectrum of the LED of LED example a (407 nm violet LED chip).
Figure 6:
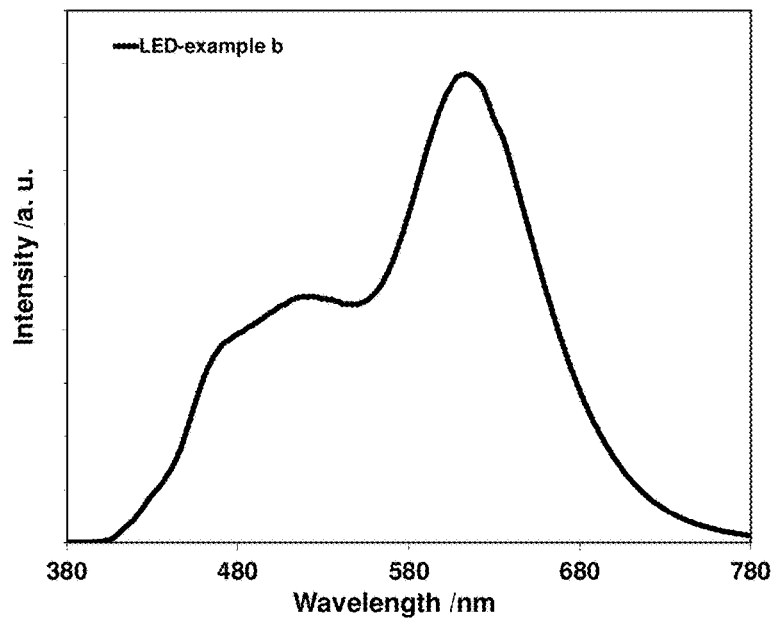
FIG. 6: Spectrum of the LED of LED example b (410 nm violet LED chip).

The invention claimed is:

1. Compound of formula (1),

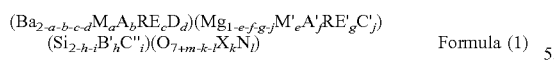

$(Ba_{2-a-b-c-d}M_aA_bRE_cD_d)(Mg_{1-e-f-g-j}M'_eA'_jRE'_gC'_j)$
$(Si_{2-h-i}B'_hC''_i)(O_{7+m-k-l}X_kN_l)$   Formula (1)

where the following applies to the symbols and indices used:

M is selected from the group consisting of Ca, Sr, Zn or mixtures of these elements;

A is selected from the group consisting of Na, K, Rb or mixtures of these elements;

RE is selected from the group consisting of La, Y, Gd or mixtures of these elements;

D is selected from the group consisting of $Eu^{2+}$, $Mn^{2+}$, $Yb^{2+}$, $Sm^{2+}$ or mixtures of these elements;

M' is selected from the group consisting of Zr, Hf or mixtures of these elements;

A' is selected from the group consisting of Li, Na or mixtures of these elements;

RE' is selected from the group consisting of Sc, Lu or mixtures of these elements;

C' is selected from the group consisting of B, Al, Ga, In or mixtures of these elements;

B' is selected from the group consisting of Ge, Sn or mixtures of these elements;

C" is selected from the group consisting of B, Al, Ga, In or mixtures of these elements;

X is selected from the group consisting of F, Cl or mixtures of these elements;

N is nitrogen;

$0 \leq a \leq 1.0$;
$0 \leq b \leq 0.6$;
$0 \leq c \leq 0.6$;
$0 \leq d \leq 2.0$;
$0 \leq e \leq 0.3$;
$0 \leq f \leq 0.3$;
$0 \leq g \leq 0.3$;
$0 \leq j \leq 0.6$;
$0 \leq h \leq 1.0$;
$0 \leq i \leq 0.6$;
$0 \leq k \leq 2.1$;
$0 \leq l \leq 2.1$; and
$-2.0 \leq m \leq 2.0$;

with the proviso that $b \neq 0$ and/or $c \neq 0$ and/or $e \neq 0$ and/or $g \neq 0$ and/or with the proviso that $f \neq 0$ and $k \neq 0$ at the same time and/or with the proviso that $f \neq 0$ and j and/or $i \neq 0$ at the same time.

2. Compound according to claim 1 wherein the following applies for the indices used:

$0 \leq a \leq 0.6$;
$0 \leq b \leq 0.4$;
$0 \leq c \leq 0.4$;
$0 \leq d \leq 1.0$;
$0 \leq e \leq 0.2$;
$0 \leq f \leq 0.2$;
$0 \leq g \leq 0.2$;
$0 \leq j \leq 0.4$;
$0 \leq h \leq 0.6$;
$0 \leq i \leq 0.4$;
$0 \leq k \leq 1.4$;
$0 \leq l \leq 1.4$; and
$-1.0 \leq m \leq 1.0$;

with the proviso that $b \neq 0$ and/or $c \neq 0$ and/or $e \neq 0$ and/or $g \neq 0$ and/or with the proviso that $f \neq 0$ and $k \neq 0$ at the same time and/or with the proviso that $f \neq 0$ and j and/or $i \neq 0$ at the same time.

3. Compound according to claim 1 wherein the following applies to the indices used:

$0 \leq a \leq 0.4$;
$0 \leq b \leq 0.2$;
$0 \leq c \leq 0.2$;
$0.01 \leq d \leq 0.2$;
$0 \leq e \leq 0.1$;
$0 \leq f \leq 0.1$;
$0 \leq g \leq 0.1$;
$0 \leq j \leq 0.2$;
$0 \leq h \leq 0.4$;
$0 \leq i \leq 0.2$;
$0 \leq k \leq 0.7$;
$0 \leq l \leq 0.7$;
$-0.5 \leq m \leq 0.5$;

with the proviso that b≠0 and/or c≠0 and/or e≠0 and/or g≠0 and/or with the proviso that f≠0 and k≠0 at the same time and/or with the proviso that f≠0 and j and/or i≠0 at the same time.

4. Compound according to claim 1, characterised in that a maximum of three of the indices a, b, c, e, f, g, j, h, I, k and l is ≠0.

5. Compound according claim 1, characterised in that a maximum of two of the indices a, b, c, e, f, g, j, h, I, k and l is ≠0.

6. Compound according to claim 1, selected from the compounds of formula (2), $$(Ba_{2-a-b-c-d}M_aK_bLa_cEu_d)(Mg_{1-e-f-g-j}Zr_eLi_fSc_gC'_j)(Si_{2-h-i}Ge_hC''_i)(O_{7+m-k-l}X_kN_l) \quad \text{Formula (2)}$$

where the following applies for the symbols and indices used:
M is selected from the group consisting of Ca, Sr or mixtures of these elements;
C' is selected from the group consisting of Al, Ga or mixtures of these elements;
C" is selected from the group consisting of Al, Ga or mixtures of these elements;
X is selected from the group consisting of F, Cl or mixtures of these elements;
N is nitrogen;
0≤a≤0.4;
0≤b≤0.2;
0≤c≤0.2;
0.005≤d≤0.4, more preferably 0.01≤d≤0.2;
0≤e≤0.1;
0≤f≤0.1;
0≤g≤0.1;
0≤j≤0.2;
0≤h≤0.4;
0≤i≤0.2;
0≤k≤0.7;
0≤l≤0.7;
−0.5≤m≤0.5;
with the proviso that b≠0 and/or c≠0 and/or e≠0 and/or g≠0 and/or with the proviso that f≠0 and k≠0 at the same time and/or with the proviso that f≠0 and j and/or i≠0 at the same time.

7. Compound according claim 1, selected from the compounds of formulae (3) to (13), $$(Ba_{2-b-d}A_bD_d)Mg\ Si_2(O_{7-b}X_b) \quad \text{Formula (3)}$$

$$(Ba_{2-b-d}A_bD_d)(Mg_{1-b}RE'_b)Si_2O_7 \quad \text{Formula (4)}$$

$$(Ba_{2-b-d}A_bD_d)Mg\ Si_2O_{7-0.5b} \quad \text{Formula (5)}$$

$$(Ba_{2-c-d}RE_cD_d)Mg\ Si_2(O_{7-c}N_c) \quad \text{Formula (5)}$$

$$(Ba_{2-d}D_d)(Mg_{1-g}RE'_g)Si_2(O_{7-g}N_g) \quad \text{Formula (7)}$$

$$(Ba_{2-d}D_d)(Mg_{1-e}M'_e)Si_2\ O_{7+e} \quad \text{Formula (8)}$$

$$(Ba_{2-d-0.5e}D_d)(Mg_{1-e}M'_e)Si_2O_{7+0.5e} \quad \text{Formula (9)}$$

$$(Ba_{2-d}D_d)(Mg_{1-f}A'_f)Si_2(O_{7-f}X_f) \quad \text{Formula (10)}$$

$$(Ba_{2-d}D_d)(Mg_{1-2f}A'_fC'_f)Si_2O_7 \quad \text{Formula (11)}$$

$$(Ba_{2-d}D_d)(Mg_{1-f}A'_f)(Si_{2-f}C''_f)O_7 \quad \text{Formula (12)}$$

$$(Ba_{2-d}D_d)(Mg_{1-2e}M'_eRE'_e)Si_2(O_{7-e}N_e) \quad \text{Formula (13)}$$

where the symbols and indices have the meanings given in claim 1 and furthermore:
b≠0 in formula (3), (4) and (5),
c≠0 in formula (6),
g≠0 in formula (7),
e≠0 in formula (8) and (9),
f≠0 in formula (10), (11) and (12), and
e≠0 in formula (13).

8. Compound according claim 1, selected from the compounds of formulae (3a) to (13a), $$(Ba_{2-b-d}K_bEu_d)Mg\ Si_2(O_{7-b}F_b) \quad \text{Formula (3a)}$$

$$(Ba_{2-b-d}K_bEu_d)Mg\ Si_2(O_{7-b}Cl_b) \quad \text{Formula (3b)}$$

$$(Ba_{2-b-d}K_bEu_d)(Mg_{1-b}Sc_b)Si_2O_7 \quad \text{Formula (4a)}$$

$$(Ba_{2-b-d}K_bEu_d)Mg\ Si_2O_{7-0.5b} \quad \text{Formula (5a)}$$

$$(Ba_{2-c-d}La_cEu_d)Mg\ Si_2(O_{7-c}N_c) \quad \text{Formula (6a)}$$

$$(Ba_{2-d}Eu_d)(Mg_{1-g}Sc_g)Si_2(O_{7-g}N_g) \quad \text{Formula (7a)}$$

$$(Ba_{2-d}Eu_d)(Mg_{1-e}Zr_e)Si_2O_{7+e} \quad \text{Formula (8a)}$$

$$(Ba_{2-d-0.5e}Eu_d)(Mg_{1-e}Zr'_e)Si_2O_{7+0.5e} \quad \text{Formula (9a)}$$

$$(Ba_{2-d}Eu_d)(Mg_{1-f}Li_f)Si_2(O_{7-f}F_f) \quad \text{Formula (10a)}$$

$$(Ba_{2-d}Eu_d)(Mg_{1-f}Li_f)Si_2(O_{7-f}Cl_f) \quad \text{Formula (10b)}$$

$$(Ba_{2-d}Eu_d)(Mg_{1-2f}Li_fAl_f)Si_2O_7 \quad \text{Formula (11a)}$$

$$(Ba_{2-d}Eu_d)(Mg_{1-2f}Li_fGa_f)Si_2O_7 \quad \text{Formula (11b)}$$

$$(Ba_{2-d}Eu_d)(Mg_{1-f}Li_f)(Si_{2-f}Al_f)O_7 \quad \text{Formula (12a)}$$

$$(Ba_{2-d}Eu_d)(Mg_{1-f}Li_f)(Si_{2-f}Ga_f)O_7 \quad \text{Formula (12b)}$$

$$(Ba_{2-d}Eu_d)(Mg_{1-2e}Zr_eSc_e)Si_2(O_{7-e}N_e) \quad \text{Formula (13a)}$$

where the symbols and indices have the meanings given in claim 1 and furthermore:
b≠0 in formula (3a), (3b), (4a) and (5a),
c≠0 in formula (6a),
g≠0 in formula (7a),
e≠0 in formula (8a) and (9a),
f≠0 in formula (10a), (10b), (11a), (11b), (12a) and (12b), and
e≠0 in formula (13a).

9. Compound according claim 1, characterised in that the compound is coated.

10. Process for the preparation of a compound according to claim 1, comprising the steps:
a) preparation of a mixture comprising all elements, which should be incorporated into the compound; and
b) calcination of the mixture at elevated temperature.

11. Process according to claim 10, characterised in that a fluxing agent is used, which is selected from the group of ammonium halides, alkaline-earth metal fluorides, carbonates, alkoxides, oxalates and/or boric acid.

12. A conversion phosphor, in particular for the partial or complete conversion of the violet or near-UV emission of a light-emitting diode into light having a longer wavelength, which comprises a compound of claim 1.

13. Light source which comprises at least one primary light source and at least one compound according to claim 1.

14. Light source according to claim 13, wherein the primary light source is a luminescent indium aluminium gallium nitride or a luminescent arrangement based on ZnO, TCO (transparent conducting oxide) or SiC, or a near-UV or violet laser, or a source which exhibits electroluminescence and/or photoluminescence, or a plasma or discharge source.

15. Lighting unit, in particular for the backlighting of display devices, characterised in that it comprises at least one light source according to claim 13.

* * * * *